US012604743B2

(12) United States Patent
Ambrosius et al.

(10) Patent No.: US 12,604,743 B2
(45) Date of Patent: Apr. 14, 2026

(54) METHOD FOR MAKING A RECESS OR OPENING INTO A PLANAR WORKPIECE USING SUCCESSIVE ETCHING

(71) Applicant: LPKF Laser & Electronics AG, Garbsen (DE)

(72) Inventors: Norbert Ambrosius, Kevelaer (DE); Roman Ostholt, Langenhagen (DE)

(73) Assignee: LPKF LASER & ELECTRONICS AG, Garbsen (DE)

( * ) Notice: Subject to any disclaimer, the term of this patent is extended or adjusted under 35 U.S.C. 154(b) by 381 days.

(21) Appl. No.: 17/711,136

(22) Filed: Apr. 1, 2022

(65) Prior Publication Data

US 2022/0223434 A1 Jul. 14, 2022

Related U.S. Application Data

(63) Continuation of application No. 15/511,272, filed as application No. PCT/DE2015/100333 on Aug. 7, 2015, now Pat. No. 11,610,784.

(30) Foreign Application Priority Data

Sep. 16, 2014 (DE) ..................... 10 2014 113 339.0
Nov. 7, 2014 (DE) ..................... 10 2014 116 291.9

(51) Int. Cl.
*H10W 70/05* (2026.01)
*B23K 26/0622* (2014.01)
(Continued)

(52) U.S. Cl.
CPC ....... *H10W 70/095* (2026.01); *B23K 26/0624* (2015.10); *B23K 26/382* (2015.10); *H05K 3/0029* (2013.01); *H10W 70/635* (2026.01);

*B23K 2101/40* (2018.08); *B23K 2103/54* (2018.08); *H05K 3/0017* (2013.01); *H10W 70/692* (2026.01)

(58) Field of Classification Search
CPC ......... H01L 21/31116; H01L 21/31138; H10P 50/642

See application file for complete search history.

(56) References Cited

U.S. PATENT DOCUMENTS

2006/0109874 A1 5/2006 Fuse et al.
2012/0125887 A1 5/2012 Shimoi et al.
(Continued)

FOREIGN PATENT DOCUMENTS

DE 102010025966 B4 1/2012
EP 2674239 A1 12/2013
(Continued)

OTHER PUBLICATIONS

Marcinkevicus, et al., "Femtosecond Laser-Assisted Three-Dimensional Microfabrication in Silica", *Optics Letters* 26, 5, pp. 277-279, Mar. 1, 2001, Optica, Washington, D.C., USA.

*Primary Examiner* — Thomas T Pham
(74) *Attorney, Agent, or Firm* — LEYDIG VOIT & MAYER LTD.

(57) ABSTRACT

A method for making a recess or opening in a planar workpiece with a thickness of less than 3 millimeters includes successively etching a plurality of flaws to form the recess or opening such that a contour of the recess or opening has a sequence of widenings and constrictions as a result of the etching.

20 Claims, 3 Drawing Sheets

(51) Int. Cl.
    *B23K 26/382*       (2014.01)
    *H05K 3/00*         (2006.01)
    *H10W 70/63*       (2026.01)
    *B23K 101/40*      (2006.01)
    *B23K 103/00*      (2006.01)
    *H10W 70/692*     (2026.01)

(56)             References Cited

U.S. PATENT DOCUMENTS

2012/0125893 A1*  5/2012  Shimoi ............. H01L 23/49827
                                    216/87
2012/0142186 A1*  6/2012  Shimoi ............. B23K 26/0006
                                257/E21.586
2012/0255935 A1  10/2012  Kakui et al.
2013/0029093 A1   1/2013  Wakioka et al.
2013/0126573 A1*  5/2013  Hosseini ............ B23K 26/0006
                                 225/2
2013/0210245 A1*  8/2013  Jackl .................... H05K 3/0029
                                439/64
2015/0166396 A1*  6/2015  Marjanovic ............. B32B 17/10
                                428/137
2019/0321921 A1*  10/2019  Paris ........................ H01L 23/15
2020/0262742 A1*  8/2020  Jaramillo ................ C03C 15/00

FOREIGN PATENT DOCUMENTS

JP           2006142342 A    6/2006
WO    WO 2012014720 A1   2/2012
WO    WO 2012108503 A    8/2012

* cited by examiner

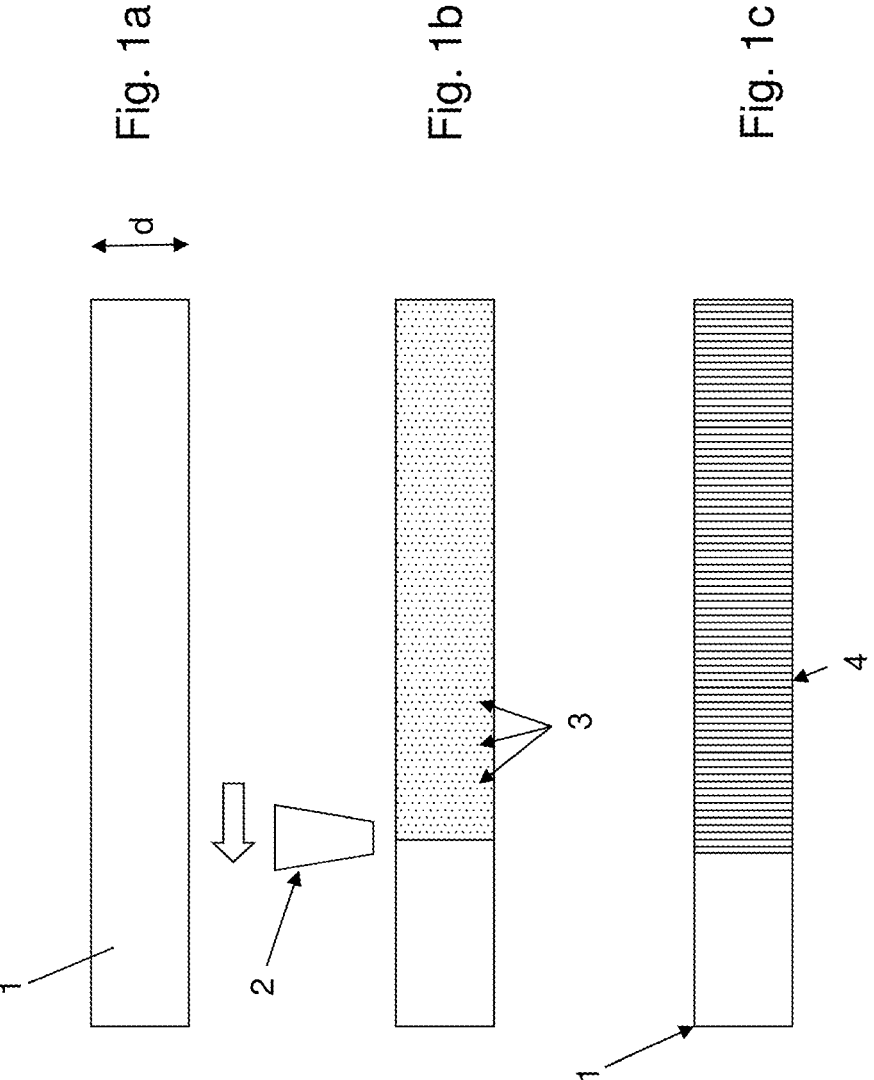

METHOD FOR MAKING A RECESS OR OPENING INTO A PLANAR WORKPIECE USING SUCCESSIVE ETCHING

CROSS-REFERENCE TO RELATED APPLICATIONS

This application is a continuation of U.S. application Ser. No. 15/511,272, which is a U.S. national stage application under 35 U.S.C. § 371 of International Application No. PCT/DE2015/100333, filed on Aug. 7, 2015, and claims benefit to German Patent Applications No. DE 10 2014 113 339.0 and 10 2014 116 291.9, respectively filed on Sep. 16, 2014, and Nov. 7, 2014. The International Application was published in German on Mar. 24, 2016, as WO 2016/041544 A1 under PCT Article 21(2).

FIELD

The invention relates to a method for making at least one recess or opening in a planar workpiece having a thickness of less than 3 mm.

BACKGROUND

In this regard, DE 10 2010 025 966 B4 discloses a method in which, in a first step, the glass workpiece is irradiated with focused laser pulses, the radiation intensity of which is so high that local athermal destruction occurs along a channel in the glass. In a second method step, the channels are widened to form holes by high-voltage energy being supplied to electrodes opposite one another, thus causing dielectric breakdowns through the glass workpiece along the channels. These breakdowns widen as a result of electrothermal heating and vaporization of the material of the holes until the progression of said widening is stopped by turning off the energy supply once the desired hole diameter is achieved. Alternatively or additionally, the channels can also be widened by reactive gases directed onto the hole sites by means of nozzles. The breakdown sites can also be widened by etching gas supplied thereto. One disadvantage is the comparatively elaborate process owing to the fact that the workpiece first has to be broken down by athermal destruction and then the diameter of the channels has to be widened to form holes in the following step.

A method for processing glass by generating filaments is known from US 2013/126573 A1. The term filament refers to a linear beam propagation within a medium as a result of self-focusing. When the suitable pulse energy and pulse duration are selected (preferably pulse sequences with a repetition rate in the megahertz range and pulse durations of less than 10 picoseconds), filaments are produced owing to the opposing effects, i.e. self-focusing as a result of the Kerr effect and defocusing from diffraction as a result of the small beam diameter. When the two effects are in equilibrium, the laser beam can propagate through the material, which is transparent to this wavelength, the diameter of said beam remaining at least substantially constant. In said method, the material is processed below the threshold for optical breakdown. As a result, the laser beam only has to be focused slightly, unlike conventional material processing with pulses in the pico- and femtosecond range.

SUMMARY

In an embodiment, the present invention provides a method for making a recess or opening in a planar workpiece with a thickness of less than 3 millimeters. The method includes successively etching a plurality of flaws to form the recess or opening such that a contour of the recess or opening has a sequence of cross-sectional widenings and constrictions as a result of the etching.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIGS. 1a-1c the sequence for making recesses in a workpiece;

DETAILED DESCRIPTION

Figures 2A, 2B:
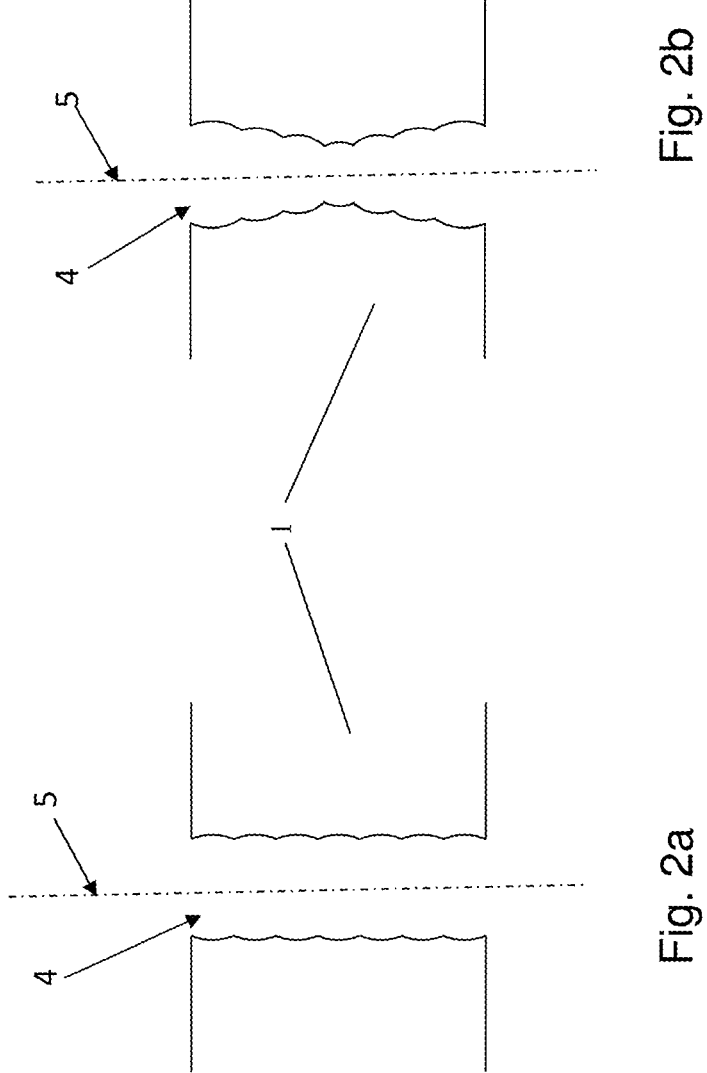
FIGS. 2a-2b possible shapes of various recesses.

The invention relates to a method for making at least one recess or opening in a planar workpiece having a thickness of less than 3 mm. On its underside, a microchip acting as a processor core typically has several hundred contact points arranged at a small distance from one another over a relatively small surface area. Owing to this small distance between them, the contact points cannot be directly applied to a circuit board (the 'motherboard'). Therefore, what is known as an 'interposer' made of insulating material is used as a connecting element, by means of which the contact base can be made wider. An insulating and redistribution layer of this kind consists, for example, of glass, glass fiber-reinforced epoxy resin or silicon, and has to be provided with a plurality of openings.

Glass is particularly advantageous as an interposer material because it is cheaper than silicon and its thermal expansion can be adapted to that of the active components, e.g. microprocessors. One difficulty is that of processing the glass to form usable interposers. In particular, the prior art has yet to succeed in creating a cost-effective method for making the plurality of openings in the glass workpiece for the purpose of creating through-connections.

A problem addressed by an aspect of the invention is that of making it possible for wet-chemical etching or plasma-phase etching to anisotropically act on flaws in the material. As a result, flaws generated in a first step can be made larger one after the other and thus a recess or opening can be produced. This method allows a plurality of recesses or openings to be generated in considerably less time.

Thus, an aspect of the invention provides a method in which, for example, a laser beam is briefly directed onto the glass workpiece such that just one chain of alterations in the workpiece material occurs, preferably along a beam axis of the laser beam, without the workpiece being destroyed, and in which in the next step material is anisotropically removed only from the regions of the workpiece in which a flaw has previously been created by means of the laser beam, and thus a recess or opening is made in the glass workpiece. Typically, the laser beam generates a linear chain of blisters. The individual blisters are made larger by the action of the etching medium.

Within the meaning of an aspect of the present invention, the term 'opening' should be taken to mean an aperture extending through the entire thickness of the workpiece, e.g. a through-hole, whereas an aperture not extending through the entire thickness of the workpiece, e.g. a blind hole, is denoted a recess.

In the following, flaws should be taken to mean locally defined blisters and/or chemical alterations.

In this case, the recess or opening is made as a result of successively etching a plurality of flaws in lines next to one another by the etching process joining the previously produced flaws one after the other, which are widened by the etching effect to form a cavity within the workpiece. As a result, the etching fluid quickly travels from flaw to flaw, with gravity not having a critical effect. Instead, the etching progresses analogously from the top downwards and vice versa, and so the etching process can in particular start on both outer surfaces at the same time.

As a result of the flaws produced as alterations within the workpiece, the etching process follows the line on which the flaws are arranged. The line can be straight or follow practically any contour, which the etching process adheres to exactly. It is thus also possible for the first time to create practically any cutting contour.

Although the longer exposure time in the region of the flaws facing the outer surfaces causes greater expansion compared with flaws deeper inside the workpiece, little conical expansion can be seen overall. Once the etching process is complete, the recess contour or opening contour thus produced is marked by a sequence of cross-sectional widenings and narrowings; the cross-sectional widenings and narrowings need not have the same cross-sectional surface area, nor be at the same distance from adjacent cross-sectional widenings and narrowings.

Since such a structure has the same shape as the outside of an earthworm (*Lumbricals terrestris*), a person skilled in the art would describe it as an earthworm structure.

The term 'earthworm structure' thus includes regular and irregular cross-sectional widenings and narrowings between which the transitions can be constant or not. A cross-sectional widening or narrowing can extend in a cross-sectional plane relative to the main axis or at an angle thereto. Adjacent cross-sectional widenings or narrowings can also have center points not on the same straight line, such that the cross-sectional widenings or narrowings are arranged so as to be offset from one another. The height of adjacent cross-sectional widenings can also be the same or different. In addition, it goes without saying that the main axis of the recess or opening can extend at an angle to the surface of the workpiece, deviating from a surface normal, whilst the cross-sectional widenings and narrowings are orientated in a plane parallel to the surface of the workpiece.

The earthworm structure is similar to another method from the prior art known as deep reactive ion etching (DRIE). This is an anisotropic plasma-phase etching process also used for the production of microstructures in silicon, e.g. for the production of silicon vias. Therefore, in the method according to the invention the following processes do not need adapting or only need adapting slightly.

The recess or opening is made as a result of successively etching a plurality of flaws in lines next to one another by the etching process joining the previously produced flaws one after the other, which are widened by the etching effect to form a cavity within the workpiece. As a result, the etching fluid quickly travels from flaw to flaw, with gravity not having a critical effect. Instead, the etching progresses analogously from the top downwards and vice versa, and so the etching process can in particular start on both outer surfaces at the same time.

As a result of the flaws produced as alterations within the workpiece, the etching process follows the line on which the flaws are arranged. The line can be straight or follow practically any contour, which the etching process adheres to exactly. It is thus also possible for the first time to create practically any cutting contour.

Although the longer exposure time in the region of the flaws facing the outer surfaces causes greater expansion compared with flaws deeper inside the workpiece, little conical expansion can be seen overall.

Once the etching process is complete, the recess contour or opening contour thus produced is marked by a sequence of cross-sectional widenings and narrowings; the cross-sectional widenings and narrowings need not have the same cross-sectional surface area, nor be at the same distance from adjacent cross-sectional widenings and narrowings. The difference in the diameters of cross-sectional widenings and narrowings can be less than 1 μm or less than 100 nm, depending on the number and density of flaws to be etched on, and so the recess or opening can even appear smooth when viewed macroscopically.

The alterations in the glass can be produced by a laser beam that is shaped by means of a diffractive-optical element in such a way that it generates a linear chain of alterations. The alterations can be generated by a sequence of pulses or by a single pulse.

Owing to the specific form of the method, recesses or openings produced have a characteristic shape. Since the etching process, which has a substantially isotropic effect, has a particularly great effect on the altered regions in the workpiece and the altered region is typically in the shape of a linear chain of alterations, a plurality of peripheral, concentric structures appear at the lateral surfaces of the recess or opening.

Owing to the structure of the openings, the method is particularly well suited for producing interposers, since the concentric peripheral microstructures produced from the successive etching of the flaws allow the subsequent metal layer to adhere particularly strongly in the hole.

The use of such workpieces as interposers for electrically connecting terminals of a plurality of homogeneous or heterogeneous microchips is particularly pertinent. On its underside, a microchip acting as a processor core typically has several hundred contact points arranged at a small distance from one another over a relatively small surface area. Owing to this small distance between them, the contact points cannot be directly applied to a circuit board (the motherboard). Therefore, an interposer is used as a connecting element, by means of which the contact base can be made wider.

An interposer of this kind preferably consists of glass or silicon, and for example contains contact surfaces, redistributions, vias, and active and inactive components.

It has already been acknowledged that according to the invention the distance between the recesses to be made in this way can be further reduced because the laser radiation does not destroy the workpiece but merely alters or reacts with the material, meaning that the laser power can also be reduced at the same time. Particularly preferably, the laser is operated at a wavelength to which the glass workpiece is transparent, thus ensuring penetration of the glass workpiece. In particular, this ensures a substantially cylindrical alteration zone coaxially around the laser beam axis, leading to the opening or recess having a constant diameter.

A wavelength of more than 1.1 μm is particularly advantageous for processing silicon.

Orientating the propagation direction of the laser beam to give the beam axis an angle of approximately 0°, 45° or 90° to the crystal symmetry is particularly advantageous when producing recesses or openings in the workpiece, in particular silicon workpieces.

Compared with the method known from the prior art, the pulse duration can be significantly reduced. In a particularly advantageous embodiment of the method according to the invention, the laser can be operated with a pulse duration of from less than 100 nanoseconds to less than 1 picosecond.

When the suitable pulse energy and pulse duration are selected (preferably pulse sequences with a repetition rate in the megahertz range and pulse durations of less than 10 picoseconds), filaments are produced owing to the opposing effects, i.e. self-focusing as a result of the Kerr effect and defocusing from diffraction as a result of the small beam diameter.

In principle, the method is not limited to particular workpiece materials. It is favorable when a dielectric material such as glass is used. It is particularly favorable when glass having a significant aluminosilicate content, in particular boron aluminosilicate, is used.

Preferably, the workpiece undergoes anisotropic material removal, at least in its altered regions, for example by means of an etching process, e.g. liquid-phase etching, plasma-phase etching or vapor phase etching, or by means of high-voltage or high-frequency vaporization, in order to thus make recesses or openings in the workpiece. Owing to the anisotropic removal of material, a sequential removal process does not have to be used for the actual removal, but rather it is possible to use a removal process acting in a planar manner, which places low demands on the process. Instead, owing to the exposure time, the material can be removed in terms of quantity and quality at the same time for all the regions pre-treated in the described manner and altered accordingly, and so the total time taken for producing the plurality of recesses or openings is significantly less.

When the two effects are in equilibrium, the laser beam can propagate through the material, which is transparent to this wavelength, the diameter of said beam remaining at least substantially constant.

In the process, when there are high peak intensities in the laser beam, other effects, e.g. plasma formation, can also be advantageously used for increased defocusing.

In practice, the interaction between defocusing and self-focusing is periodic, producing a chain of altered material regions. Depending on the strength of the effects, an associated channel or 'plasma channel' can also be produced.

In principle, the formation of the filament can remain limited to a portion of the material having the maximum thickness. The filament stops being formed when the beam leaves the Kerr medium and diverges, or when the intensity of the beam has decreased to such an extent that the defocusing diffraction outweighs the self-focusing.

In practice, a glass fiber-reinforced epoxy resin plate provided with a plurality of holes is used as an interposer, for example. Conductor tracks that run into the holes in order to fill them extend on the top surface of the glass fiber mat and, on the other side of the glass fiber mat, lead as far as to terminal contacts of the processor core. When heating occurs, however, the expansion rates of the core processor and the glass fiber mat are different and so mechanical stresses occur between these two components.

The filaments can be made by means of laser processing in which the processing head is moved into position and the irradiation is carried out alternately. Preferably, however, while the radiation is directed onto the workpiece there is constant relative movement between the processing head and the workpiece such that the laser beam is thus continuously guided in a 'fluid' movement over the workpiece. This thus means that a continuous change in the relative position produces an extremely short processing duration.

In the process, the position of the material relative to the processing head can be changed at a constant rate, such that the distance between the alterations to be made follows a predetermined grid size when the pulse frequency is constant.

Particularly preferably, the radiation source is operated at a wavelength to which the workpiece is transparent, ensuring penetration of the workpiece. In particular, this ensures a substantially cylindrical alteration zone coaxially around the laser beam axis, leading to the opening or recess having a constant diameter.

It may also be advantageous for a surface region to additionally be removed by the radiation source in order to form the zone of action for the anisotropic removal in such a way that a conical inlet region to the filaments in produced. In this way, the subsequent through-connection can be made simpler. In addition, the action of an etching medium is for example concentrated in this region.

In one embodiment of the method according to the invention, the radiation source can be operated with a pulse duration of less than 50 ps, preferably less than 10 ps.

In another, likewise particularly favorable embodiment of the invention, after being altered the workpiece is provided with a planar metal layer that covers at least some, in particular a plurality of openings to be made later. In a subsequent step, material is removed from the modified regions in such a way that a recess closed at one end by the metal layer is produced. In the process, the metal layer is applied, preferably after the alterations yet before the material removal, in such a way that the metal layer applied for example as a conductor track closes the recess following the material removal and thus at the same time forms an optimum base for a contact to be applied thereto. In this case, the through-connection is produced in the region of the recess using methods known per se. By applying the metal layer as a conductor track, a desired circuit image can also be produced in a simple manner.

In another, likewise particularly favorable embodiment of the method, at least one surface of the workpiece is coated with an etch resist prior to the laser treatment. The action of the laser beam as the preferred electromagnetic radiation source simultaneously removes the etch resist on at least one surface in a point-like zone of action and produces the alteration in the workpiece. In this way, the unaltered regions are protected from being undesirably affected in the subsequent etching process, and the surface of the material is thus not damaged. In the process, the etch resist does not prevent the material therebelow from being altered. Instead, the etch resist is either permeable to the laser radiation or is removed in a virtually point-like manner by the laser radiation, e.g. vaporized. In addition, the possibility is not ruled out of the etch resist containing substances that promote the alterations, e.g. accelerate the alteration process.

It goes without saying that the aforementioned metal layer can be applied before the etch resist is applied to one of the outer surfaces of the material, in order to use said metal layer as a base for the desired through-connection once the etch resist has been removed.

The etch resist could remain on the surface of the material following the treatment. Preferably, however, the etch resist is removed from the surface of the material in a manner known per se following the anisotropic material removal.

In principle, the method is not limited to particular material compositions of the material. It is particularly favorable, however, if the material has a significant aluminosilicate content, in particular a boron aluminosilicate content.

In another, likewise pertinent embodiment of the invention, the distance between filaments produced adjacently in the workpiece along a separating line is designed such that the altered regions are directly adjacent to one another or are at a very small distance from one another, in order to thus separate defined material regions.

The separation is carried out once the filaments have been made along the separating line as a result of internal stresses in the material or owing to an external application of force. Alternatively or in addition, the internal stresses can also be caused by thermal stresses, in particular by a high temperature difference.

FIG. 1 is a diagram showing the sequence of several method steps for making an opening in a planar workpiece by irradiation with laser radiation and subsequent etching by means of individual method steps when making an opening in a planar workpiece 1. For this purpose, in FIG. 1*a* laser radiation 2 is directed onto a surface of the workpiece 1. The thickness d of the workpiece 1 is at most 3 mm. The exposure time of the laser radiation 2 is selected to be extremely short, such that the workpiece 1 is only altered concentrically around a beam axis of the laser beam. For this purpose, the laser is operated at a wavelength to which the workpiece 1 is transparent. A region altered in this way having flaws 3 is shown in FIG. 1*b* in the form of a linear chain of blisters. In a subsequent method step shown in FIG. 1*c*, the action of an etching medium results in anisotropic material removal in the regions of the workpiece 1 formed by the flaws 3 and which have been altered previously by the laser radiation 2. Along the cylindrical zone of action, a recess 4 in the form of an opening is thus produced in the workpiece 1.

Figures 3A, 3B, 3C:
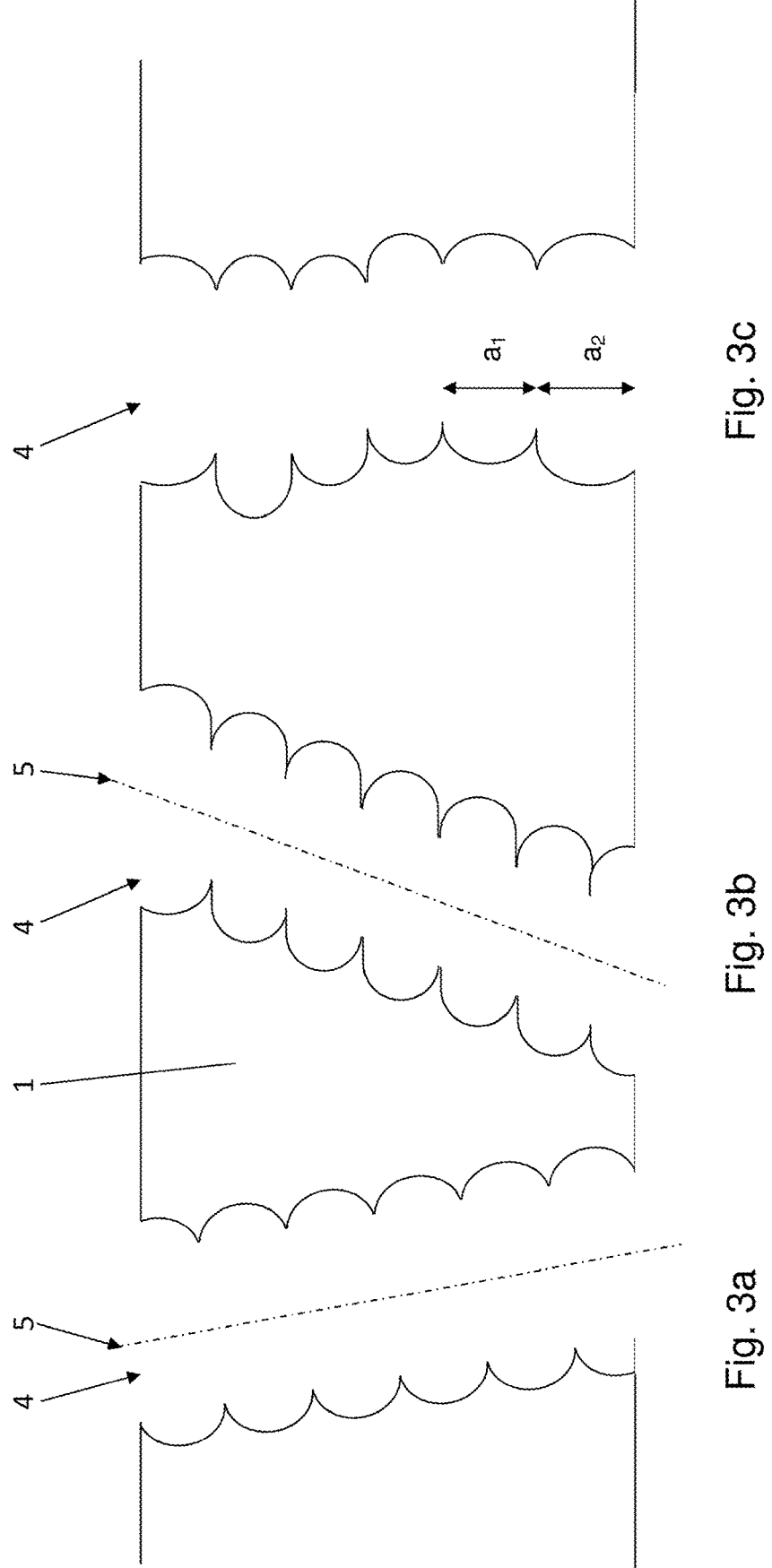
FIGS. 3a-3c further possible shapes of various recesses.

The opening has a plurality of peripheral concentric structures on its lateral surface, as can be seen in the illustrations in FIGS. 2*a* and 2*b* and in FIGS. 3*a* to 3*c*.

In the process, the recess 4 is made as a result of successively etching a plurality of flaws 3 in lines next to one another by the etching process joining the previously produced flaws 3 one after the other, which are widened by the etching action to form a cavity within the workpiece 1. As a result, the etching fluid quickly travels from flaw 3 to flaw 3. Since gravity does not have a critical effect, the etching progresses both from the top and the bottom and starts at both outer surfaces at the same time. Owing to the comparatively long exposure time of the etching medium in the region of the outer surfaces, the flaws 3 are conically expanded in the region of the outer surfaces, as can be seen in FIG. 2*b*.

As a result of the flaws 3 produced as alterations within the workpiece 1, the etching process follows a line 5 on which the flaws 3 are arranged. The line 5 can be straight or follow practically any contour, which the etching process adheres to exactly. It is thus also possible for the first time to create practically any cutting contour.

Although the longer exposure time in the region of the flaws 3 facing the outer surfaces causes greater expansion compared with flaws 3 deeper inside the workpiece, little conical expansion can be seen overall.

Once the etching process is complete, the contour of the recess 4 or opening thus produced is marked by a sequence of cross-sectional widenings and narrowings, the shape of which resembles an earthworm. The cross-sectional widenings and narrowings need not have the same cross-sectional surface area, as can be seen in FIGS. 2*b* and 3*c* for example, nor do they need to be at the same distance a1, a2 from adjacent cross-sectional widenings and narrowings, as shown in FIG. 3*c*. A cross-sectional widening or narrowing can be arranged in a cross-sectional plane relative to the main axis or, as shown in FIG. 3*a*, at an angle thereto.

Adjacent cross-sectional widenings or narrowings can also have center points on a common line 5 at an angle to the surface of the workpiece 1, such that the cross-sectional widenings or narrowings are arranged so as to be offset from one another, it being possible to orientate the cross-sectional widenings or narrowings at an angle to the outer surface, as shown in FIG. 3*a*, or in parallel with the outer surface, as shown in FIG. 3*b*.

As can be seen in FIG. 3*c*, the centers of area of adjacent cross-sectional widenings can be offset such that said widenings are in particular not arranged on a common straight line.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

What is claimed is:

1. A method for making a recess or opening in a planar workpiece with a thickness of less than 3 millimeters, the method comprising:

successively etching a plurality of flaws to form the recess or opening having a diameter and a cross-section, such that the cross-section of the recess or opening has a sequence of widenings and constrictions of the diameter as a result of the etching, wherein the widenings, as viewed in the cross-section, have different concave arcuate shapes between adjacent ones of the constrictions.

2. The method according to claim 1, wherein the sequence of widenings and constrictions include at least one widening that has a different maximum diameter relative to an adjacent one of the widenings, and/or at least one constriction that has a different minimum diameter relative to an adjacent one of the constrictions.

3. The method according to claim 1, wherein the sequence of widenings and constrictions include at least one widening and constriction that have a different spacing in a direction of extension of the recess or opening relative to an adjacent one of the widenings and constrictions.

4. The method according to claim 1, wherein the widenings and/or the constrictions have center points which do not lie on a same straight line.

5. The method according to claim 1, wherein the widenings and/or the constrictions are arranged offset to one another.

6. The method according to claim 5, wherein the widenings and/or the constrictions have center points which lie on a same straight line that is inclined relative to a surface normal of the workpiece.

7. The method according to claim 1, wherein heights of adjacent ones of the widenings differ from one another in a direction of extension of the recess or opening.

8. The method according to claim 1, wherein a total surface area of at least one of the widenings between adjacent ones of the constrictions differs from a total surface area of an adjacent one of the widenings.

9. The method according to claim 1, wherein the sequence of widenings and constrictions extends across an entire thickness of the workpiece so as to form the recess or opening as a through-hole.

10. The method according to claim 1, further comprising forming the flaws by a sequence of pulses or a single pulse of laser radiation.

11. The method according to claim 10, wherein the sequence of pulses or the single pulse of laser radiation comprises a spatial beam that reacts across an entire thickness of the workpiece.

12. The method according to claim 11, wherein the flaws are formed as a chain of blisters that are separated from each other along the chain.

13. The method according to claim 12, wherein the chain of blisters extends across an entire thickness of the workpiece.

14. The method according to claim 13, wherein, during the successive etching, etching fluid enlarges each of the blisters until breaking through into the next blister along the chain until all of the blisters have been connected to form the recess or opening as a through-hole.

15. The method according to claim 12, wherein, during the successive etching, etching fluid enlarges each of the blisters until breaking through into the next blister along the chain until all of the blisters have been connected to form the recess or opening.

16. The method according to claim 1, wherein heights of the concave arcuate shapes in a direction of extension of the recess or opening are different relative to one another.

17. The method according to claim 1, wherein a maximum distance from the concave arcuate shapes to a center axis of the recess or opening are different relative to one another.

18. The method according to claim 1, wherein the sequence of widenings and constrictions form an earthworm shape of the recess or opening.

19. The method according to claim 1, wherein the planar workpiece is formed from glass.

20. The method according to claim 19, further comprising forming the flaws by a single pulse of laser radiation that comprises a spatial beam that reacts across an entire thickness of the workpiece.

* * * * *